(12) United States Patent
Zhang (10) Patent No.: US 9,910,327 B2
(45) Date of Patent: Mar. 6, 2018

(54) ARRAY SUBSTRATE, MANUFACTURING METHOD THEREOF AND DISPLAY DEVICE

(71) Applicant: BOE Technology Group Co., Ltd., Beijing (CN)

(72) Inventor: Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,981

(22) PCT Filed: Dec. 31, 2015

(86) PCT No.: PCT/CN2015/100199
§ 371 (c)(1),
(2) Date: Jan. 9, 2017

(87) PCT Pub. No.: WO2017/031908
PCT Pub. Date: Mar. 2, 2017

(65) Prior Publication Data
US 2017/0248827 A1    Aug. 31, 2017

(30) Foreign Application Priority Data

Aug. 27, 2015 (CN) .......................... 2015 1 0536219

(51) Int. Cl.
*H01L 27/14* (2006.01)
*G02F 1/1362* (2006.01)
(Continued)

(52) U.S. Cl.
CPC .... *G02F 1/136209* (2013.01); *G02F 1/13439* (2013.01); *G02F 1/134309* (2013.01);
(Continued)

(58) Field of Classification Search
CPC ............. H01L 27/1248; H01L 27/1262; H01L 29/78633
(Continued)

(56) References Cited

U.S. PATENT DOCUMENTS

2015/0362771 A1   12/2015   Jin et al.
2016/0306225 A1   10/2016   Zhang et al.

FOREIGN PATENT DOCUMENTS

CN          1538194 A       10/2004
CN          104076550 A     10/2014
(Continued)

OTHER PUBLICATIONS

First Office Action from Chinese Patent Application No. 201510536219.8, dated Jul. 31, 2017, 12 pages.
(Continued)

*Primary Examiner* — Jami M Valentine
(74) *Attorney, Agent, or Firm* — Westman, Champlin & Koehler, P.A.

(57) ABSTRACT

An array substrate, a manufacturing method thereof and a display device are disclosed. The array substrate includes: a substrate; a plurality of pixel units provided on the substrate, each of the pixel units including a plurality of functional layers; and a light shielding assembly arranged between adjacent pixel units. The light shielding assembly including: a light shielding layer; a light absorption layer overlaid on the light shielding layer; and an antireflection layer overlaid on the light absorption layer. By means of providing an antireflection layer the light shielding assembly, it can decrease the reflection of the external ambient light on the light shielding assembly, thereby improving the display contrast and the image display quality.

19 Claims, 4 Drawing Sheets (51) Int. Cl.
      *G02F 1/1343*     (2006.01)
      *H01L 27/12*      (2006.01)
      *H01L 29/786*     (2006.01)

(52) U.S. Cl.
      CPC ...... *H01L 27/1248* (2013.01); *H01L 27/1262* (2013.01); *H01L 29/78633* (2013.01)

(58) Field of Classification Search
      USPC .......................................................... 257/72
      See application file for complete search history.

(56) References Cited

FOREIGN PATENT DOCUMENTS

| | | |
|---|---|---|
| CN | 104730603 A | 6/2015 |
| CN | 104749816 A | 7/2015 |
| CN | 104765191 A | 7/2015 |
| CN | 105093654 A | 11/2015 |
| JP | 2011-221316 A | 11/2011 |

OTHER PUBLICATIONS

International Search Report and Written Opinion of International Application No. PCT/CN2015/100199, dated May 24, 2016, 14 pages.
English translation of Box No. V of the Written Opinion for the International Searching Authority for International Application No. PCT/CN2015/100199, 2 pages.

ARRAY SUBSTRATE, MANUFACTURING METHOD THEREOF AND DISPLAY DEVICE

CROSS-REFERENCE TO RELATED APPLICATION

This application is a Section 371 National Stage Application of International Application No. PCT/CN2015/100199, filed on Dec. 31, 2015, entitled "ARRAY SUBSTRATE, MANUFACTURING METHOD THEREOF AND DISPLAY DEVICE", which claims priority to Chinese Application No. 201510536219.8, filed on Aug. 27, 2015, incorporated herein by reference in their entirety.

BACKGROUND

Technical Field

Embodiments of the present disclosure relate to an array substrate for a display device, and more particularly, to an array substrate, a manufacturing method of an array substrate, and a display device comprising an array substrate.

Description of the Related Art

Currently, those display elements such as a thin film transistor liquid crystal display (TFT-LCD), an organic light emitting diode (OLED) unit, an active matrix organic light emitting diode (AMOLED) and the like are widely used in a display device, since they have a lot of characteristics, such as good shock resistance, wide viewing angle, wide operation temperature, high contrast, flexible display and the like. In addition, an advanced super dimension switch (ADS for short) technology is applied. In such a technology, a fringing electric field is generated by pixel electrodes in the same plane, so that rotation conversion may be made to alignment liquid crystal molecules located between the electrodes and located right above the electrodes in a planar direction (parallel to a substrate), thereby improving light transmittance of a liquid crystal layer while increasing viewing angle.

In a conventional TFT-LCD display, a black matrix is provided between adjacent sub-pixels so as to shield thin film transistors, data lines, gate lines, and the like, which are provided on a substrate, and to absorb visible light which is not controlled by liquid crystal deflection and other light which would adversely affect display effect, thereby allowing the liquid crystal display to have excellent display effect. In the prior art, the black matrix is mainly composed of organic resin coated with carbon black particles. Since the dielectric constant of the organic resin material is relatively large, significantly large parasitic capacitances may be generated between a common electrode and a gate line, and/or between a common electrode and a data line, which will generate a larger signal delay and reduce the display quality of the display screen of the display device. In an alternative solution, the black matrix is made from metal materials. However, the metal material can reflect ambient light, resulting in decreasing in the contrast and affecting the picture quality.

SUMMARY

The embodiments of the present disclosure provide an array substrate, a manufacturing method thereof, and a display device. In the array substrate, a light shielding assembly can decrease the reflection of external ambient light, thereby improving the display contrast of the display device and the display quality of an image.

According to an aspect of the present disclosure, there is provided an array substrate, comprising: a substrate; a plurality of pixel units provided on the substrate, each of the pixel units comprising a plurality of functional layers; and a light shielding assembly arranged between adjacent pixel units, wherein the light shielding assembly comprises: a light shielding layer; a light absorption layer overlaid on the light shielding layer; and an antireflection layer overlaid on the light absorption layer.

According to an embodiment of the present disclosure, the antireflection layer is formed of a transparent conductive film.

According to an embodiment of the present disclosure, the functional layers comprise a planarization layer, a first electrode layer disposed on the planarization layer, a first passivation layer disposed on the first electrode layer and a second electrode layer disposed on the first passivation layer.

According to an embodiment of the present disclosure, the light shielding assembly is disposed between the first electrode layer and the planarization layer.

According to an embodiment of the present disclosure, the antireflection layer of the light shielding assembly and the first electrode layer are made from the same material and disposed in the same layer.

According to an embodiment of the present disclosure, the light shielding assembly is disposed between the second electrode layer and the first passivation layer.

According to an embodiment of the present disclosure, the antireflection layer of the light shielding assembly and the second electrode layer are made from the same material and disposed in the same layer.

According to an embodiment of the present disclosure, the light shielding assembly is disposed between the first electrode layer and the first passivation layer.

According to an embodiment of the present disclosure, the light shielding layer is made from a metal material or a metal alloy material.

According to an embodiment of the present disclosure, the antireflection layer is made from at least one of indium tin oxide, indium zinc oxide, and aluminum zinc oxide.

According to an embodiment of the present disclosure, the light shielding layer is made from at least one of aluminum, chromium, copper, molybdenum, titanium, aluminum-neodymium alloy, copper-molybdenum alloy, molybdenum-tantalum alloy and molybdenum-neodymium alloy.

According to an embodiment of the present disclosure, the light absorption layer is made of a metal oxide, a metal nitride, or a metal oxynitride.

According to another aspect of the present disclosure, there is provided a display device, comprising the array substrate according to any one of the above embodiments.

According to further another aspect of the present disclosure, there is provided a manufacturing method of an array substrate, comprising steps of: forming a plurality of pixel units on the substrate, wherein each of the pixel units comprises a plurality of functional layers; and forming a light shielding assembly between adjacent pixel units, wherein the light shielding assembly comprises: a light shielding layer; a light absorption layer overlaid on the light shielding layer; and an antireflection layer overlaid on the light absorption layer.

In the array substrate, the manufacturing method thereof and the display device according to the above embodiments of the present disclosure, by means of providing an antireflection layer in the light shielding assembly, it can decrease the reflection of the external ambient light on the light shielding assembly, thereby improving the display contrast and the display quality of an image.

BRIEF DESCRIPTION OF THE DRAWINGS

In order to clearly understand the objectives, technical solutions and advantages of the present disclosure, the present disclosure will be described in detail below with reference to the accompanying drawing, in combination with the specific embodiments. In the drawings.

DETAILED DESCRIPTION OF PREFERRED EMBODIMENTS

The technical solutions of the present disclosure will be described in more detail with reference to the following embodiments, together with the accompanying drawings. In the specification, the same or similar reference numerals refer to the same or similar parts. The following description of the embodiments of the present disclosure with reference to the accompanying drawings is intended to explain the general inventive concept of the present disclosure, but should not be interpreted as a limitation of the present disclosure.

According to a general inventive concept of the present disclosure, there is provided an array substrate, comprising: a substrate; a plurality of pixel units provided on the substrate, wherein each of the pixel units comprises a plurality of functional layers; and a light shielding assembly arranged between adjacent pixel units. The light shielding assembly comprises: a light shielding layer; a light absorption layer overlaid on the light shielding layer; and an antireflection layer overlaid on the light absorption layer. By means of providing an antireflection layer in the light shielding assembly, it can decrease the reflection of the external ambient light incident on the light shielding assembly, thereby improving the display contrast and the image display quality of the display device including such an array substrate.

In the following detailed description, for purposes of explanation, numerous specific details are set forth in order to provide a thorough understanding of the embodiments of the present disclosure. However, it will be apparent that one or more embodiments may be implemented without these specific details. In other instances, well known structures and devices are schematically shown in the drawings so as to simplify the drawings.

As shown in FIGS. 1-4, the embodiments of the present invention provide an array substrate, including: a substrate 100 made of glass or a transparent resin material; a plurality of pixel units provided on the substrate 100, wherein each of the pixel units includes a plurality of functional layers (described in detail below); and a light shielding assembly 11 arranged between adjacent pixel units. The light shielding assembly 11 includes: a light shielding layer (or a metal layer) 11a; a light absorption layer 11b overlaid on the light shielding layer 11a; and an antireflection layer 11c overlaid on the light absorption layer 11b. By means of providing an antireflection layer 11c in the light shielding assembly 11, it can decrease the reflection of the external ambient light (e.g., the light incident from the pixel unit onto the light shielding assembly) incident on the light shielding assembly 11, thereby improving the display contrast and the image display quality of the display device including such an array substrate.

Figure 1:
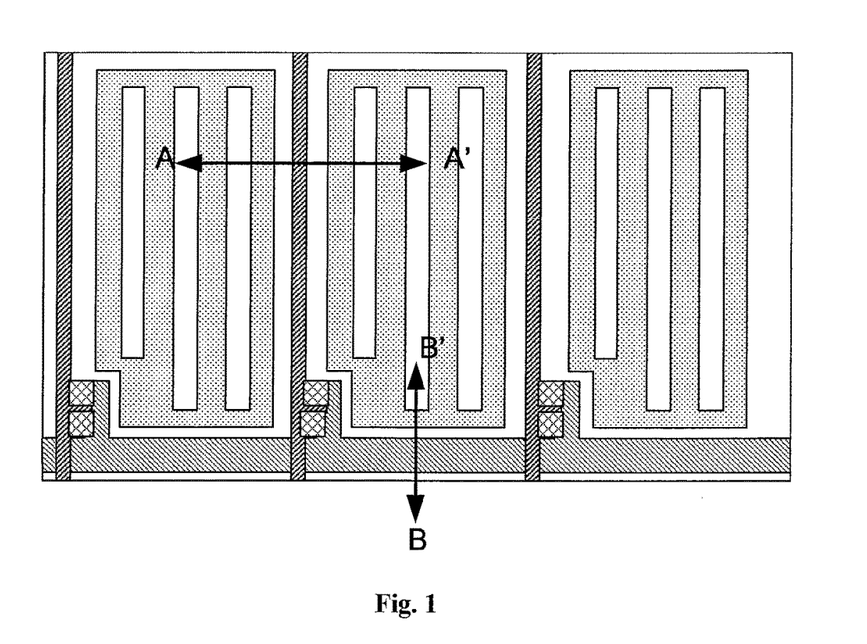
FIG. 1 is a partial top view of an array substrate according to an exemplary embodiment of the present disclosure.
Figure 2:
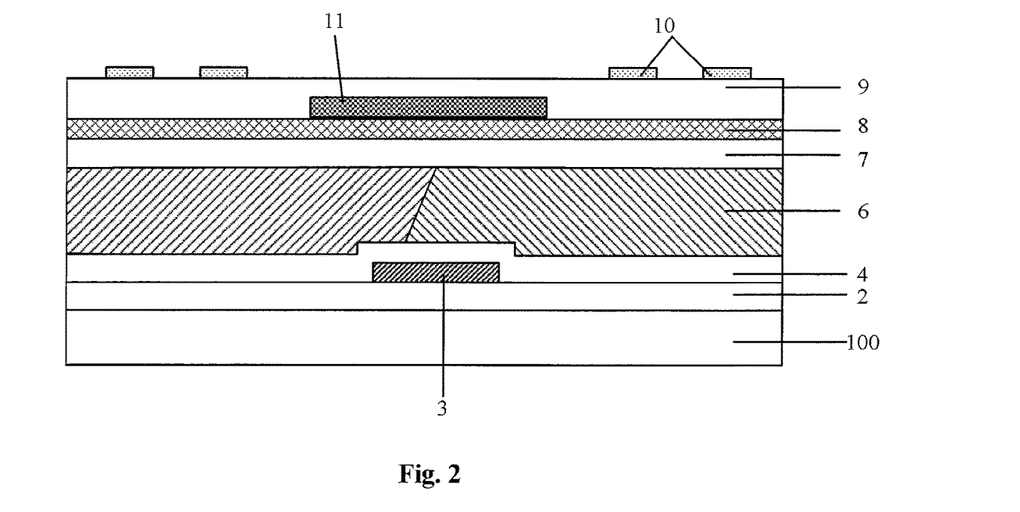
FIG. 2 is a partial cross-sectional view of an array substrate according to a first exemplary embodiment of the present disclosure taken along line A-A' of FIG. 1.
Figure 3:
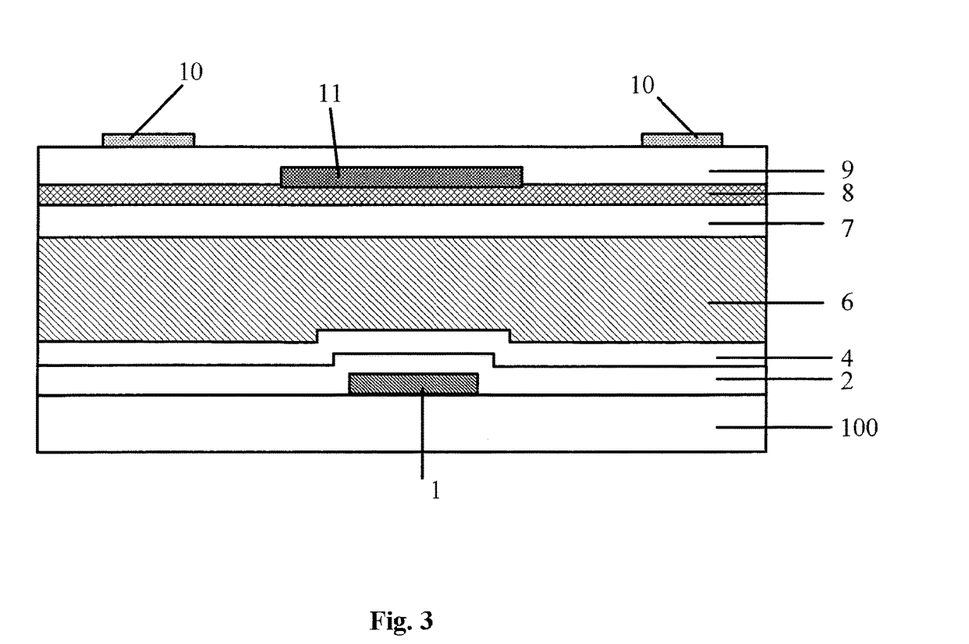
FIG. 3 is a partial cross-sectional view of the array substrate according to the first exemplary embodiment of the present disclosure taken along line B-B' of FIG. 1.
Figure 4:
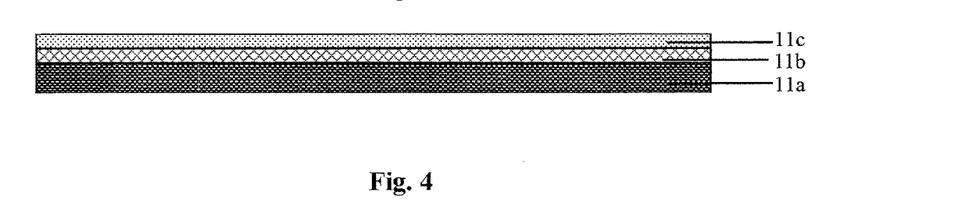
FIG. 4 is a partial enlarged cross-sectional view of a light shielding assembly according to an exemplary embodiment of the present disclosure.

In an exemplary embodiment, as shown in FIGS. 2-4, the functional layers include a planarization layer 7, a first electrode layer 8 on the planarization layer 7, a first passivation layer 9 disposed on the first electrode layer 8 and a second electrode layer 10 disposed on the first passivation layer 9. For example, the first electrode layer may be provided as a planar electrode and used as a common electrode; the second electrode layer may be provided as a plurality of strip electrodes and used as pixel electrodes. Further, the functional layers further include a gate insulation layer 2 formed on the substrate 100, a gate line 1 formed on the gate insulation layer 2, a data line 3, a thin film transistor, a second passivation layer 4 provided on the substrate 100 and covering the gate line 1, the data line 3 and the thin film transistor, and color filters 6 provided on the second passivation layer 4. The planarization layer 7 is formed over the color filters 6. For example, the color filters 6 may include red, green, and blue filters, or may include red, green, blue, and white filters. The light shielding assembly 11 is arranged in such a way that it corresponds to the thin film transistor, the data line, the gate line and the like arranged on the substrate in a thickness direction thereof, so as to shield the thin film transistor, the data line, the gate line and the like.

In an exemplary embodiment, the antireflection layer 11c is formed of a transparent conductive film. In this way, the antireflection layer 11c can be made of the same material as that of the first and second electrode layers, so as to reduce the manufacturing cost of the antireflection layer. Further, the transparent conductive film is made from a metal oxide selected from at least one of indium tin oxide (ITO), indium zinc oxide (IZO), aluminum zinc oxide (AZO), etc., and has a thickness of 300 Å to 1000 Å. Thus, the light incident onto the light shielding assembly 11 may pass through the antireflection layer 11c to the light absorption layer and be absorbed by the light absorption layer, thereby the reflection of the incident light on the light shielding assembly is reduced, therefore, the display contrast of the array substrate and the image display quality is improved.

In an exemplary embodiment, the light shielding layer 11a is made from a metal material or a metal alloy material, so as to reduce the resistance of the light shielding layer. Further, the light shielding layer is made from a metal material, such as aluminum, chromium, copper, molybdenum, titanium (Al, Cr, Cu, Mo, Ti), or the like, which has good electrical conductivity and is not transparent, or made from a metal alloy selected from at least one of aluminum-neodymium alloy (Al—Nd), copper-molybdenum alloy (Cu—Mo), molybdenum-tantalum alloy (Mo—Ta) and molybdenum-neodymium alloy (Mo—Nd), etc. As a result, the resistance of the light shielding assembly may be further reduced, and the light shielding effect may be improved.

In an exemplary embodiment, the black light absorption layer is made of a metal oxide, a metal nitride, or a metal oxynitride having a low reflectance. For example, the light absorption layer is made of at least one of metal oxide or metal nitride corresponding to Al, Cr, Cu, Mo, and Ti, or at least one of molybdenum-tantalum oxide, molybdenum-titanium oxide, molybdenum-tantalum nitride, and molybdenum-titanium nitride. In this way, it is possible to improve the absorption effect for the light incident from the antireflection layer, and further improve the image display quality.

In the first embodiment of the array substrate shown in FIGS. 2 and 3, the light shielding assembly 11 is disposed between the first electrode layer 8 and the first passivation layer 9. That is to say, the light shielding assembly 11 is provided on the first electrode layer 8, the first passivation layer 9 covers the light shielding assembly 11, and the second electrode layer 10 is provided on the first passivation layer 9. Further, the light shielding layer 11a is made of a metal or a metal alloy. Thus, the light shielding layer 11a is directly provided on the first electrode layer 8. Since the light shielding layer has a relatively low resistance and therefore good electrical conductivity, the electric conductivity of the first electrode layer is not adversely affected. Furthermore, if materials having good electrical conductivity are applied, the electrical conductivity of the first electrode layer can be improved.

Figure 6:
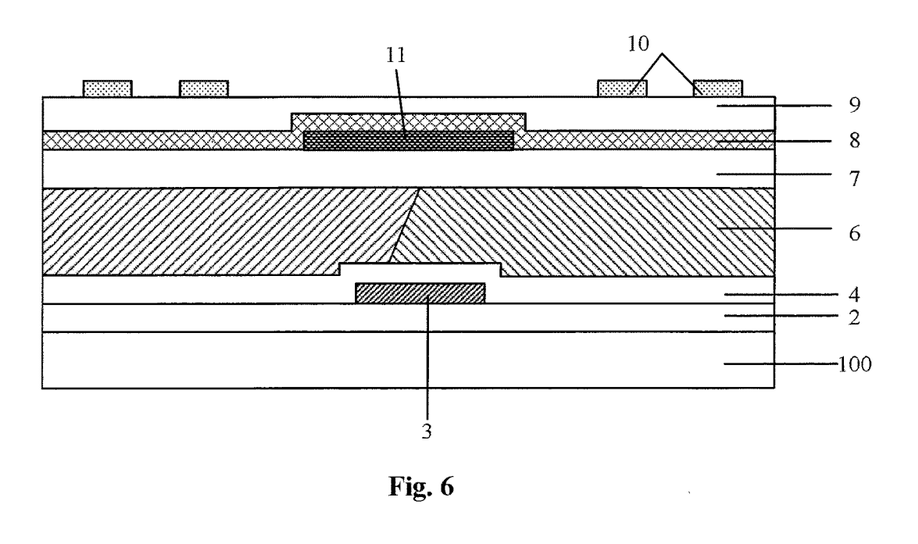
FIG. 6 is a partial cross-sectional view of an array substrate according to a second exemplary embodiment of the present disclosure taken along line A-A' of FIG. 1.

In the second embodiment of the array substrate shown in FIG. 6, the light shielding assembly 11 is provided between the first electrode layer 8 and the planarization layer 7. Further, since the antireflection layer 11c and the first electrode layer 8 are both made of a transparent conductive film, the antireflection layer 11c may be made of the same material as the first electrode layer 8, for example, ITO, IZO or AZO, and disposed in the same layer as the first electrode layer 8. In this way, the antireflection layer 11c and the first electrode layer 8 may be formed by a single patterning process using a single mask, resulting in reducing the number of the patterning processes, thereby reducing the number of the used masks and reducing the manufacturing cost.

Figure 7:
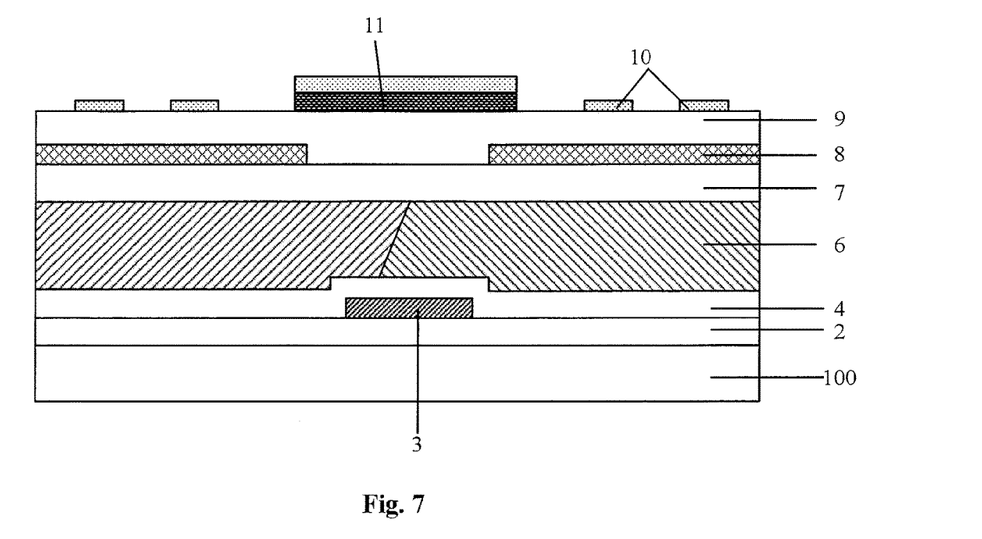
FIG. 7 is a partial cross-sectional view of an array substrate according to a third exemplary embodiment of the present disclosure taken along line A-A' of FIG. 1.
Figure 8:
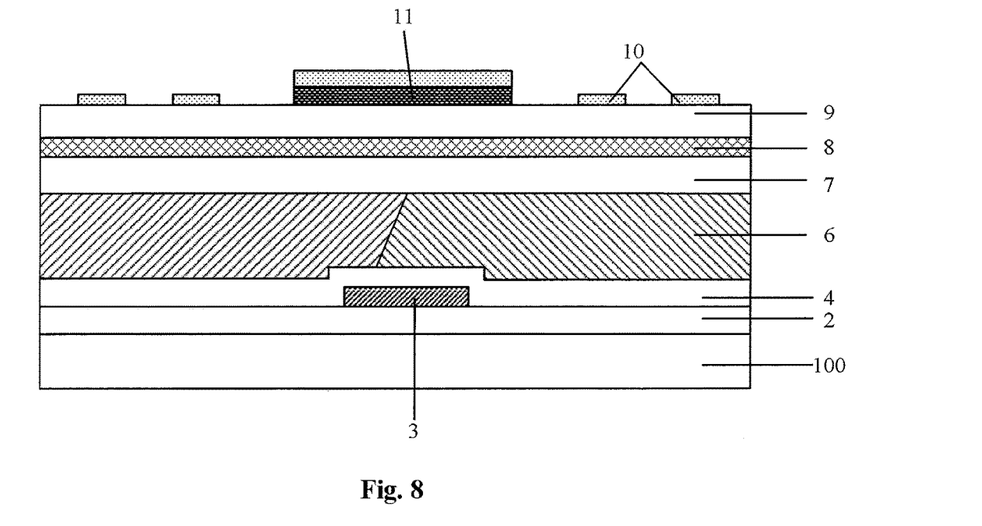
FIG. 8 is a partial cross-sectional view of an array substrate according to a fourth exemplary embodiment of the present disclosure taken along line A-A' of FIG. 1.

In the third and fourth embodiments of the array substrate shown in FIGS. 7 and 8, the light shielding assembly 11 is disposed between the second electrode layer 10 and the first passivation layer 9. That is to say, the light shielding assembly 11 is provided on the first passivation layer 9, and the second electrode layer 10 covers the light shielding assembly 11. Further, the antireflection layer 11c of the light shielding assembly 11 and the second electrode layer 10 are made of the same material, for example, ITO, IZO or AZO, and disposed in the same layer. In this way, the antireflection layer 11c and the second electrode layer 10 may be formed by a single patterning process using a single mask, resulting in reducing the number of the patterning processes, thereby reducing the number of the used masks and reducing the manufacturing cost.

In the third embodiment shown in FIG. 7, the first electrode layer 8 is discontinuous underneath the light shielding assembly 11. In the fourth embodiment shown in FIG. 8, the first electrode layer 8 is continuous underneath the light shielding assembly 11, i.e., the first electrode layer 8 extends underneath the light shielding assembly 11.

According to a further aspect of the inventive concept of the present disclosure, there is provided a manufacturing method of an array substrate, comprising steps of: forming a plurality of pixel units on a substrate, wherein each of the pixel units comprises a plurality of functional layers; and forming a light shielding assembly between adjacent pixel units. The light shielding assembly comprises: a light shielding layer; a light absorption layer overlaid on the light shielding layer; and an antireflection layer overlaid on the light absorption layer. By means of providing an antireflection layer in the light shielding assembly, it can decrease the reflection of the external ambient light on the light shielding assembly, thereby improving the display contrast and the display quality of an image.

In one exemplary embodiment, the step of forming the light shielding assembly 11 between adjacent pixel units includes: depositing a light shielding layer 11a by a sputtering process using a metal or metal alloy material; depositing a light absorption layer 11b on the light shielding layer 11a by a reactive sputtering process using a metal or metal alloy material; and forming an antireflection layer on the light absorption layer 11b using a transparent conductive film.

More specifically, the step of depositing the light shielding layer 11a by the sputtering process using the metal or metal alloy material includes: depositing the light shielding layer 11a by the sputtering process in an argon (Ar) atmosphere using for example Al, Cr, Cu, Mo, Ti or any other metals, or AlNd, CuMo, MoTa, MoNd or any other metal alloys, wherein the thickness of the light shielding layer 11a is 1000 Å to 2000 Å. As a result, the light shielding layer 11a may have a relatively low resistance.

In the step of depositing the light absorption layer 11b on the light shielding layer 11a by the reactive sputtering process using the metal or metal alloy materials, by using oxygen ($O_2$), nitrogen ($N_2$) or a mixed gas of oxygen and nitrogen ($O_2$ and $N_2$) as a reaction gas, a metal oxide, a metal nitride, or a metal oxynitride is deposited in an Ar atmosphere by the reactive sputtering process, to act as the light absorption layer 11b. The thickness of the light absorption layer 11b is 300 Å to 1000 Å. As a result, the light absorption effect may be improved.

In an exemplary embodiment, the transparent antireflection layer 11c is configured to reduce the reflection of the ambient light by means of an interference extinction, for example, the antireflection layer may be formed of a transparent conductive film of ITO, IZO, AZO, or the like, and has a thickness of 300 Å to 1000 Å. Thus, the light incident onto the light shielding assembly 11 may pass through the antireflection layer 11c to the light absorption layer and be absorbed by the light absorption layer. The antireflection layer made from such materials and having such a thickness may optimize the effect of the interference extinction and reduce the reflection of the incident light on the light shielding assembly, thereby improving the display contrast of the array substrate and the display quality.

In an exemplary embodiment, as shown in FIGS. 2-4, the functional layers include a planarization layer 7, a first electrode layer 8 disposed on the planarization layer 7, a first passivation layer 9 disposed on the first electrode layer 8 and a second electrode layer 10 disposed on the first passivation layer 9. For example, the first electrode layer may be provided as a planar electrode and used as a common electrode; the second electrode layer may be provided as a plurality of strip electrodes and used as pixel electrodes. Further, the functional layers further include a gate insulation layer 2 formed on the substrate 100, a gate line 1 formed on the gate insulation layer 2, a data line 3, a thin film transistor, a second passivation layer 4 provided on the substrate 100 and covering the gate line 1, the data line 3 and the thin film transistor, and color filters 6 provided on the second passivation layer 4. The planarization layer 7 is formed over the color filters 6. For example, the color filters 6 may include red, green, and blue filters, or may include red, green, blue, and white filters. The light shielding assembly 11 is arranged in such a way that it corresponds to the thin film transistor, the data line, the gate line and the like arranged on the substrate in a thickness direction thereof, so as to shield the thin film transistor, the data line, the gate line and the like.

It should be noted that, the gate insulation layer 2, the gate line 1, the data line 3, the thin film transistor, the second passivation layer 4, the color filters 6, and the planarization layer 7 may be sequentially formed on the substrate 100 using conventional metals.

For example, in an exemplary embodiment, the gate line 1, the gate insulation layer 2, an active layer of the thin film transistor, a source electrode and a drain electrode of the thin film transistor, and a second passivation layer 4 are formed on the substrate 100 by conventional techniques; R, G, B color filters are formed on the second passivation layer 4; an organic insulation film is used to planarize the color filters to form the planarization layer 7. The planarization layer 7 made of the organic insulation film has a relatively good flatness and a relatively low dielectric constant, for example, a dielectric constant of 5 or less, and for example, the organic insulation film may be made of a resin material such as acrylic resin, polyimide resin, or the like.

As shown in FIGS. 4 and 6, after the formation of the planarization layer 17, the step of depositing the light shielding layer 11*a* by the sputtering process using the metal or metal alloy material is performed on the planarization layer 7, and the following steps are performed after the formation of the light absorption layer 11*b*: patterning the formed light shielding layer 11*a* and light absorption layer 11*b* to form a preliminary pattern of the light shielding assembly on a region of the planarization layer corresponding to the gate line 1, the data line 3, the thin film transistor, and the like; depositing the transparent conductive film on the preliminary pattern of the light shielding assembly and the planarization layer 7; and patterning the transparent conductive film to form the antireflection layer 11*c* on the light absorption layer 11*b* and to form the first electrode layer 8 on the planarization layer 7.

For example, the step of patterning the transparent conductive film includes the steps of: coating photoresist on the light absorption layer 11*b* of the preliminary pattern of the light shielding assembly and the planarization layer 7; exposing and developing the photoresist using a mask; removing a portion of the conductive film by means of an etching process to form the light shielding assembly 11 and the first electrode layer 8; and peeling off the non-removed photoresist. The light absorption layer 11*b* and the planarization layer 7 may be continuously or discontinuously arranged. In this way, the antireflection layer 11*c* of the light shielding assembly 11 and the first electrode layer 8 are formed by a single patterning process using a single mask, it reduces the number of the patterning processes and the number of the used masks, thereby reducing the manufacturing cost.

As described above, in the embodiments of the present disclosure, the patterning process generally includes processes such as coating photoresist, exposing, developing, etching, peeling, and the like.

As shown in FIGS. 4 and 7, the step of depositing the light shielding layer 11*a* by the sputtering process using the metal or metal alloy material is performed on the first passivation layer 9, and the following steps are performed after the formation of the light absorption layer 11*b* : patterning the formed light shielding layer 11*a* and light absorption layer 11*b* to form a preliminary pattern of the light shielding assembly on a region of the first passivation layer 9 corresponding to the gate line 1, the data line 3, the thin film transistor, and the like; depositing the transparent conductive film on the preliminary pattern of the light shielding assembly and the first passivation layer 9; and patterning the transparent conductive film to form the antireflection layer 11*c* on the light absorption layer 11*b* and to form the first electrode layer 8 on first passivation layer 9. For example, the second electrode layer 10 is formed as a plurality of strip electrodes, so as to function as pixel electrodes.

In the third embodiment shown in FIG. 7, the first electrode layer 8 is discontinuous underneath the light shielding assembly 11. Accordingly, it is necessary to perform a patterning process during forming the first electrode layer 8, so as to discontinue the first electrode layer 8 underneath the light shielding assembly 11. In the fourth embodiment shown in FIG. 8, the first electrode layer 8 is continuous underneath the light shielding assembly 11, i.e., the first electrode layer 8 extends underneath the light shielding assembly 11.

As shown in FIGS. 2-4, in an embodiment, a light shielding assembly 11 is formed on the first electrode layer 8, and a first passivation layer is formed on the light shielding assembly 11 and the first electrode layer 8.

The light shielding assembly manufactured according to the above-described embodiments functions shielding the gate line, the data line and the thin film transistor. For example, a metal with a low reflectance covers on a position corresponding to the gate line, the data line and the thin film transistor, or covers on a position corresponding to the gate line and the thin film transistor, or covers on a position corresponding to the thin film transistor. In this way, the display contrast of the array substrate may be improved, and the image display quality may be improved.

According to a still further embodiment of the present disclosure, there is provided a display device comprising the array substrate of the above-described various embodiments. For example, the array substrate including the light shielding assembly according to the various embodiments of the present disclosure may be applied to an ADS, IPS (In-Plane Switching), TN (Twisted Nematic), or VA (Vertical Alignment) display mode, and may be applied to display devices based on an Oxide, LTPS (Low Temperature Poly-Silicon) and α-Si (Amorphous Silicon) technology, such as LCD, OLED and the like, and may be applied to a Non-COA (Color Filter On Array) structure, and may be applied to a touch structure as a bridging metal. The display device may be a mobile phone, a tablet computer, a television, a display, a notebook computer, a digital photo frame, a navigator, an electronic paper or any other products or components having a display function.

Figure 5:
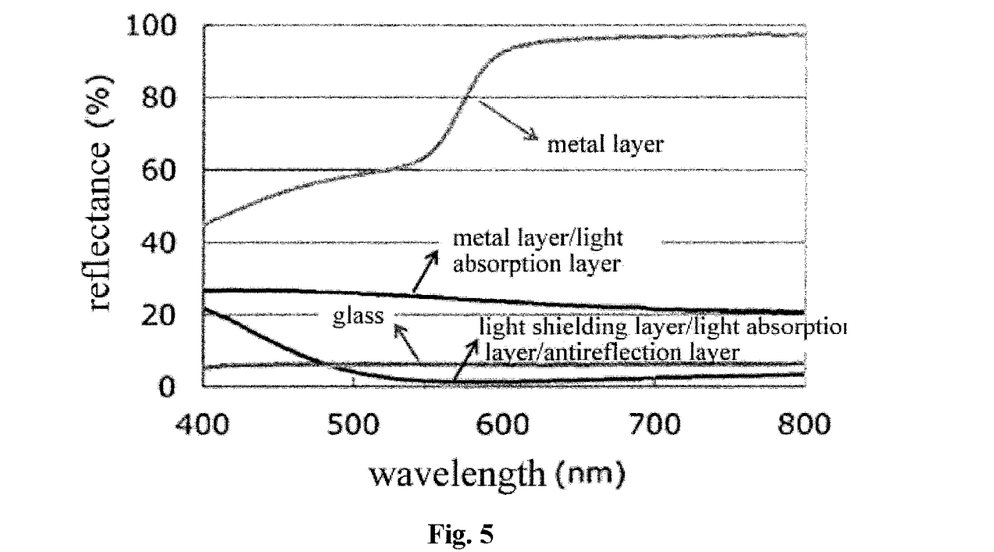
FIG. 5 is a schematic comparison view showing reflectances of a light shielding assembly according to an embodiment of the present disclosure, a metal layer, a metal layer/light absorption layer and a glass for light having a relative wavelength.

FIG. 5 is a schematic comparison view showing reflectances of the light shielding assembly according to the embodiments of the present disclosure, a metal layer, a metal layer/light absorption layer and a glass for light having a relative wavelength. As can be seen from FIG. 5, the reflectance of the light shielding assembly according to the various embodiments of the present disclosure is significantly less than that of the pure metal layer, and less than that of a composite layer including a metal layer and a light absorption layer, and even less than the glass, for incident light having a wavelength of 500 nm or more. In particular, for incident light having a wavelength of approximately 600 nm, the reflectance of the light shielding assembly according to the various embodiments of the present disclosure is close to zero. Therefore, it will be appreciated that the array substrate, the manufacturing method thereof and the display device according to the above-described embodiments of the present disclosure can reduce the reflection of the ambient light on the light shielding assembly by means of providing an antireflection layer in the light shielding assembly, thereby improving the display contrast and the image display quality.

The objectives, technical solutions and advantages of the present disclosure have been described in further detail with reference to the above-described specific embodiments. It should be understood that the description merely refers to the specific embodiments of the present disclosure, but not limits the present disclosure. Any modifications, equivalents, and improvements made to the present disclosure without departing from the spirit and scope of the present disclosure fall within the scope of the disclosure.

What is claimed is:

1. An array substrate, comprising:
    a substrate;
    a plurality of pixel units provided on the substrate, each of the pixel units comprising a plurality of functional layers; and
    a light shielding assembly arranged between adjacent pixel units, wherein the light shielding assembly comprises:
        a light shielding layer;
        a light absorption layer overlaid on the light shielding layer; and
        an antireflection layer overlaid on the light absorption layer,
    wherein the antireflection layer is made from at least one of indium tin oxide, indium zinc oxide, and aluminum zinc oxide.

2. The array substrate according to claim 1, wherein the antireflection layer is formed of a transparent conductive film.

3. The array substrate according to claim 2, wherein the functional layers comprise a planarization layer, a first electrode layer disposed on the planarization layer, a first passivation layer disposed on the first electrode layer and a second electrode layer disposed on the first passivation layer.

4. The array substrate according to claim 3, wherein the light shielding assembly is disposed between the first electrode layer and the planarization layer.

5. The array substrate according to claim 4, wherein the antireflection layer of the light shielding assembly and the first electrode layer are made from the same material and disposed in the same layer.

6. The array substrate according to claim 3, wherein the light shielding assembly is disposed between the second electrode layer and the first passivation layer.

7. The array substrate according to claim 6, wherein the antireflection layer of the light shielding assembly and the second electrode layer are made from the same material and disposed in the same layer.

8. The array substrate according to claim 3, wherein the light shielding assembly is disposed between the first electrode layer and the first passivation layer.

9. The array substrate according to claim 8, wherein the light shielding layer is made from a metal material or a metal alloy material.

10. The array substrate according to claim 1, wherein the light shielding layer is made from at least one of aluminum, chromium, copper, molybdenum, titanium, aluminum-neodymium alloy, copper-molybdenum alloy, molybdenum-tantalum alloy and molybdenum-neodymium alloy.

11. The array substrate according to claim 1, wherein the light absorption layer is made of a metal oxide, a metal nitride, or a metal oxynitride.

12. A display device, comprising the array substrate according to claim 1.

13. A manufacturing method of an array substrate, comprising steps of:
    forming a plurality of pixel units on the substrate, wherein each of the pixel units comprises a plurality of functional layers; and
    forming a light shielding assembly between adjacent pixel units, wherein the light shielding assembly comprises:
        a light shielding layer;
        a light absorption layer overlaid on the light shielding layer; and
        an antireflection layer overlaid on the light absorption layer,
    wherein the antireflection layer is made from at least one of indium tin oxide, indium zinc oxide, and aluminum zinc oxide.

14. A display device, comprising the array substrate according to claim 2.

15. A display device, comprising the array substrate according to claim 3.

16. A display device, comprising the array substrate according to claim 4.

17. A display device, comprising the array substrate according to claim 5.

18. A display device, comprising the array substrate according to claim 6.

19. A display device, comprising the array substrate according to claim 7.

* * * * *